United States Patent
Doan et al.

(10) Patent No.: US 12,426,410 B2
(45) Date of Patent: Sep. 23, 2025

(54) SEMICONDUCTOR COMPONENTS AND SEMICONDUCTOR STRUCTURES AND METHODS OF FABRICATION

(71) Applicant: TSLC CORPORATION, Chu-nan (TW)

(72) Inventors: Trung Tri Doan, Baoshan Township (TW); Chen-Fu Chu, Hsinchu (TW); Shih-Kai Chan, Miaoli County (TW); David Trung Doan, Baoshan Township, Hsinchu County (TW); Yi-Feng Shih, Toufen (TW)

(73) Assignee: TSLC Corporation, Chu-nan (TW)

( * ) Notice: Subject to any disclaimer, the term of this patent is extended or adjusted under 35 U.S.C. 154(b) by 733 days.

(21) Appl. No.: 16/936,805

(22) Filed: Jul. 23, 2020

(65) Prior Publication Data

US 2021/0066547 A1  Mar. 4, 2021

Related U.S. Application Data

(60) Provisional application No. 62/892,644, filed on Aug. 28, 2019.

(51) Int. Cl.
*H10H 20/819* (2025.01)
*H10H 20/01* (2025.01)
*H10H 20/84* (2025.01)

(52) U.S. Cl.
CPC .......... *H10H 20/819* (2025.01); *H10H 20/01* (2025.01); *H10H 20/018* (2025.01); *H10H 20/84* (2025.01); *H10H 20/034* (2025.01)

(58) Field of Classification Search
CPC . H01L 33/20; H01L 33/0093; H01L 33/0095; H01L 33/44; H01L 2933/0025;
(Continued)

(56) References Cited

U.S. PATENT DOCUMENTS 6,071,795 A  6/2000  Cheung et al.
6,815,312 B2  11/2004  Furukawa et al.
(Continued)

FOREIGN PATENT DOCUMENTS

EP  0 616376  11/1997
JP  2002366054 A  12/2002
(Continued)

OTHER PUBLICATIONS

Corresponding Japanese patent specification claiming priority to application No. 2020-016200 filed on Feb. 23, 2020 entitled "Addition Curable Silicone Pressure-Sensitive Adhesive Composition and Cured Product Thereof", pp. 1-26.
(Continued)

*Primary Examiner* — Su C Kim
(74) *Attorney, Agent, or Firm* — Stephen A. Gratton

(57) ABSTRACT

A semiconductor component for fabricating semiconductor structures includes a plate having an elastomeric polymer layer thereon and at least one semiconductor structure adhesively attached to the elastomeric polymer layer. A semiconductor structure includes a first semiconductor layer and a second semiconductor layer with an active layer therebetween. The semiconductor structure also includes a plurality of mesas including at least one shorting mesa and at least one non-shorting mesa physically connected to the first semiconductor layer. A method for fabricating semiconductor structures includes the steps of: forming a plurality of semiconductor layer structures on the substrate, forming an elastomeric polymer layer on a receiving plate and attaching the elastomeric polymer layer to the semiconductor structures, and separating the semiconductor structures from the substrate with the semiconductor structures attached to the receiving plate.

22 Claims, 22 Drawing Sheets

(58) Field of Classification Search
CPC ......... H01L 33/0075; H01L 2933/0033; H01L 20/819; H01L 20/01; H01L 20/018; H01L 20/84; H01L 20/034; H01L 20/0137; H01L 20/036
See application file for complete search history.

(56) References Cited

U.S. PATENT DOCUMENTS

| | | | |
|---|---|---|---|
| 6,818,532 | B2 | 11/2004 | Yeom et al. |
| 6,959,854 | B2 | 11/2005 | Yokokawa et al. |
| 7,473,571 | B2 | 1/2009 | Hwang et al. |
| 7,670,929 | B2 | 3/2010 | Bourdelle et al. |
| 7,736,945 | B2 | 6/2010 | Schiaffino |
| 7,842,547 | B2 | 11/2010 | Shelton et al. |
| 8,294,172 | B2 | 10/2012 | Yoo et al. |
| 8,921,204 | B2 | 12/2014 | Chu et al. |
| 9,651,214 | B2 | 5/2017 | Lee et al. |
| 10,256,217 | B2 | 4/2019 | Lee et al. |
| 2005/0023550 | A1 | 2/2005 | Eliashevich et al. |
| 2005/0227455 | A1 | 10/2005 | Park et al. |
| 2013/0248922 | A1* | 9/2013 | Kuo ............... H01L 27/156 257/99 |
| 2013/0313562 | A1 | 11/2013 | Epler et al. |
| 2015/0333230 | A1* | 11/2015 | Moon ............... H01L 33/46 257/88 |
| 2015/0364639 | A1 | 12/2015 | Hong et al. |
| 2017/0018537 | A1* | 1/2017 | Shih ............... H01L 33/58 |
| 2018/0158706 | A1* | 6/2018 | Hsu ............... H01L 21/67288 |
| 2019/0165231 | A1 | 5/2019 | Doan et al. |
| 2021/0111318 | A1 | 4/2021 | Lin et al. |
| 2021/0119088 | A1 | 4/2021 | Doan et al. |
| 2022/0131056 | A1 | 4/2022 | Lin et al. |

FOREIGN PATENT DOCUMENTS

| | | |
|---|---|---|
| JP | 2003332633 A | 11/2003 |
| JP | 2006128710 A | 5/2006 |
| JP | 2010161221 A | 7/2010 |
| JP | 2010177390 A | 8/2010 |
| JP | 2017168548 A | 9/2017 |
| JP | 2017533453 A | 11/2017 |
| JP | 2018060993 A | 4/2018 |
| JP | 2018531504 A | 10/2018 |
| JP | 2019067892 A | 4/2019 |
| KR | 10-2019-0057054 | 5/2019 |

OTHER PUBLICATIONS

M. K. Kelly et al., Optical patterning of GaN films, Applied Physics Letters 69, Sep. 16, 1996, p. 1749-1751.

W. S. Wong et al., Damage-free separation of GaN thin films from sapphire substrates, Applied Physics Letters 72, Feb. 2, 1998, p. 599-601.

W. S. Wong et al, Fabrication of thin-film InGaN light-emitting diode membranes by laser lift-off, Applied Physics Letters, Sep. 6, 1999, p. 1360-1362.

U.S. Appl. No. 10/118,316, filed Apr. 9, 2002, Jong L. Lee et al., entitled "Method of Fabrication Vertical Structure LEDS", pp. 1-25, abandoned.

* cited by examiner

SEMICONDUCTOR COMPONENTS AND SEMICONDUCTOR STRUCTURES AND METHODS OF FABRICATION

CROSS REFERENCE TO RELATED APPLICATION

This application claims priority from U.S. Provisional No. 62/892,644, filed Aug. 28, 2019, which is incorporated herein by reference.

FIELD

This disclosure relates to semiconductor fabrication and to methods for fabricating semiconductor components and semiconductor structures.

BACKGROUND

Various semiconductor structures, such as light emitting diode (LED) dice, can be fabricated on a substrate, such as a sapphire wafer. For example, micro light emitting diodes (MLED) dice can be fabricated on a sapphire substrate along with a connecting secondary substrate. The connecting secondary substrate allows the semiconductor structures to be removed from the substrate to form discrete light emitting diode (LED) dice. In general, prior art fabrication processes that utilize a substrate are complicated and produce a low yield of light emitting diode (LED) dice.

The present disclosure is directed to a semiconductor component having a receiving plate with an elastomeric polymer layer thereon for fabricating semiconductor structures. The present disclosure is also directed to semiconductor structures having novel mesa structures including shorting mesas and non-shorting mesas that facilitate adhesion to the elastomeric polymer layer. The present disclosure is also directed to a method for fabricating semiconductor structures on a substrate in which semiconductor structures are formed on the substrate, attached to a receiving plate having an elastomeric polymer layer and then separated from the substrate.

SUMMARY

A semiconductor component for fabricating semiconductor structures includes a plate having an elastomeric polymer layer thereon and at least one semiconductor structure adhesively attached to the elastomeric polymer layer. The plate facilitates separation of the semiconductor structures from a substrate during fabrication. Each semiconductor structure includes a first semiconductor layer and a second semiconductor layer with an active layer therebetween. Each semiconductor structure also includes a plurality of mesas comprising separated portions of the first semiconductor layer, the second semiconductor layer and the active layer. The mesas include at least one shorting mesa and at least one non-shorting mesa physically connected to the first semiconductor layer. In addition, the shorting mesas includes a strapping conductive layer electrically connecting the second semiconductor layer and the first semiconductor layer. The mesas can also include planar metal contact pads, which facilitate adhesive attachment to the elastomeric polymer layer, and provide physical and electrical structures in a completed semiconductor structure, such as electrodes for applying power to the semiconductor structure.

A semiconductor structure includes a first semiconductor layer having a first polarity, and a second semiconductor layer having a second polarity with an active layer therebetween configured to emit electromagnetic radiation. For example, the first semiconductor layer can comprise an n-conductive layer and the second semiconductor layer can comprise a p-conductive layer, or vice versa. The active layer can comprise a pn-junction zone for generating or detecting electromagnetic radiation during the operation of the semiconductor die. The semiconductor structure also includes a plurality of mesas comprising separated portions of the first semiconductor layer, the second semiconductor layer and the active layer. The mesas have the same height with planar surfaces configured for engagement with a polymer elastomeric layer. In addition, the mesas include at least one shorting mesa and at least one non-shorting mesa physically connected to the first semiconductor layer. Further, the shorting mesa includes a strapping conductive layer electrically connecting the second semiconductor layer and the first semiconductor layer. Stated differently, the strapping metal layer connects the two opposite polarity layers making in effect a short circuit. The semiconductor structure can optionally include one or more metal contact pads formed on the shorting mesa and the non-shorting mesa. In an illustrative embodiment, the semiconductor structure comprises a flip chip light emitting diode (FCLED) die and the mesas provide the physical structure for supporting metal contact pads.

A method for fabricating semiconductor structures includes the initial step of providing a substrate having a desired size and shape. The substrate can have a flat or patterned configuration and transparency to various types of electromagnetic radiation including laser radiation and thermal radiation. Exemplary materials for the substrate include sapphire, silicon, gallium nitride, silicon carbide, germanium (Ge), zinc oxide (ZnO), gallium nitride (GaN), aluminum nitride (AlN), zinc selenium (ZnSe) and gallium arsenide (GaAs).

The method also includes the step of forming a semiconductor layer structure on the substrate. The semiconductor layer structure includes a first semiconductor layer and a second semiconductor layer with an active layer therebetween. A plurality of mesas are formed in the semiconductor layer structure by forming trenches to define the semiconductor structures. Each mesa comprises portions of the first semiconductor layer, the second semiconductor layer, and the active layer. In addition, the mesas include at least one shorting mesa and at least one non-shorting mesa physically connected to the first semiconductor layer. The mesas on each semiconductor structure are electrically and physically connected by the first semiconductor layer which is continuous within one semiconductor structure.

The method also includes the step of forming an elastomeric polymer layer on a receiving plate and then attaching the elastomeric polymer layer to the semiconductor structures. The elastomeric polymer layer has a desired adhesive force and functions to hold the semiconductor layer structures on the receiving plate. In addition, the elastomeric polymer layer functions to absorb kinetic energy to prevent damage to the semiconductor layer structures during a subsequent separating step, wherein the semiconductor layer structures are separated from the substrate.

The method also includes the step of separating the semiconductor layer structures from the substrate with the semiconductor layer structures attached to the receiving plate. The removing step can be performed using a laser lift-off (LLO) process by directing a uniform laser beam through the substrate to the semiconductor layer at the interface with the substrate to lift off the semiconductor layer structures onto the elastomeric polymer layer on the receiving plate.

During the laser lift-off (LLO) process, a laser beam can be focused on one or more semiconductor structures at a time in sequence to remove either all the semiconductor structures, or just selected semiconductor structures on the substrate. In addition, the laser beam has an outline greater than the footprint of a single semiconductor structure to form laser lift-off (LLO) areas that are greater than the areas of the semiconductor structures. In addition, during the lift-off (LLO) process, the elastomeric polymer layer functions as a shock absorber to absorb kinetic energy from the semiconductor structures via momentum energy transfer. The LLO process can lift-off one semiconductor structure at a time. In addition, the semiconductor structure can be lifted-off to a specific (x,y) location on the elastomeric polymer layer. Rather than laser-lift off (LLO) process, other suitable techniques for separating the semiconductor structures from the substrate can include chemical mechanical polishing (CMP) and etching.

Following the separating step, the method can also include the step of cleaning and/or etching the semiconductor structures on the receiving plate. Finally, the method can include the step of removing the semiconductor structures from the receiving plate as discrete semiconductor dice. The removing step can be performed using a pick and place mechanism or using a stamp having a higher adhesive force than the elastomeric polymer layer.

In an illustrative embodiment of the method for fabricating a semiconductor layer structure can be grown epitaxially using a suitable deposition process such as vapor phase epitaxy (VPE), metal organic chemical vapor deposition (MOCVD), molecular beam epitaxy (MBE), liquid phase epitaxy (LPE), or chemical vapor deposition (CVD). For example, a semiconductor layer structure in the form of an epitaxial stack can comprise a p-type confinement layer, an n-type confinement layer, and an active layer (multiple quantum well (MQW) layer) between the confinement layers configured to emit or detecting light or electromagnetic radiation. The semiconductor layer structure can be based, for example, on a III-V compound semiconductor material, which comprises at least one element from main group III, such as for example Al, Ga, In, and one element from main group V, such as for example N, P, As. In particular, the term "III-V compound semiconductor material" encompasses the group of binary, ternary and quaternary compounds, which contain at least one element from main group III and at least one element from main group V. For example, nitride and phosphide compound semiconductors. N-conductive and p-conductive layers can respectively be produced by appropriate doping of the semiconductor material. The semiconductor layer structure can also be based on a II-VI compound semiconductor material. In the illustrative embodiment, the p-type confinement layer comprises p-GaN and the n-type layer comprises n-GaN. Rather than GaN, the p-type confinement layer and the n-type layers can comprise various other compound semiconductor materials, such as AlGaN. InGaN, and AlInGaN. The active layer can be formed of suitable materials such as an InGaN layer sandwiched between two layers of a material with a wider band gap such as GaN.

DETAILED DESCRIPTION

Figure 1:
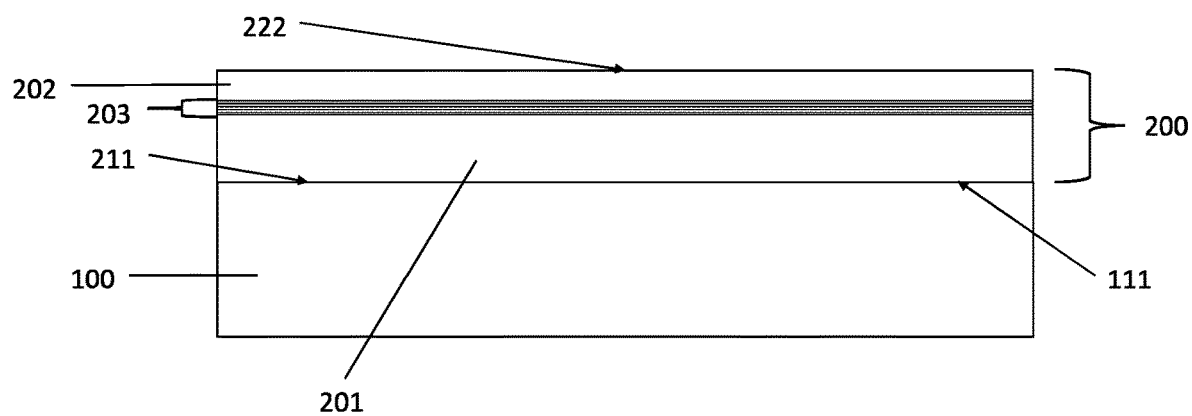
FIG. 1 is an enlarged schematic cross sectional view illustrating a step in the method of forming a semiconductor layer structure on a substrate.

Referring to FIG. 1, initially a substrate 100 having a surface 111 is provided. The substrate 100 can comprise a wafer. In addition, the surface 111 can be flat, or patterned, such as a patterned sapphire substrate (PSS). The substrate 100 can also have radiation-transmissive characteristics or transparency, particularly to electromagnetic radiation in the visible, infrared and/or ultraviolet spectral ranges. Exemplary materials for the substrate 100 include sapphire, silicon, gallium nitride, silicon carbide, germanium (Ge), zinc oxide (ZnO), gallium nitride (GaN), aluminum nitride (AlN), zinc selenium (ZnSe) and gallium arsenide (GaAs). In the examples to follow, the substrate 100 comprises sapphire unless otherwise noted.

As shown in FIG. 1, a semiconductor layer structure 200 can be formed on the surface 111 of the substrate 100, such as by epitaxial growth. The semiconductor layer structure 200 comprises a first semiconductor layer 201, a second semiconductor layer 202 and an active layer 203 between the first semiconductor layer 201 and the second semiconductor layer 202. By way of example, the first semiconductor layer 201 can comprise an n-conductive layer and the second semiconductor layer 202 can comprise a p-conductive layer, or vice versa. The active layer 203 can be configured for generating electromagnetic radiation or for absorbing and transforming electromagnetic radiation into electrical signals or energy. All of these layers can be fabricated using a suitable deposition technique, such as vapor phase epitaxy (VPE), metal organic chemical vapor deposition (MOCVD), molecular beam epitaxy (MBE) or liquid phase epitaxy (LPE).

Still referring to FIG. 1, the semiconductor layer structure 200 has a first main surface 211 facing the substrate 100 and a second main surface 222 which is remote from the substrate 100. For improving the quality of the epitaxial semiconductor layers of the semiconductor layer structure 200, the substrate 100 may have a patterned surface 111. Moreover, the semiconductor layer structure 200 can be grown onto the patterned surface 111 of the substrate 100, so that the first main surface 211 may reproduce the patterned surface 111.

Figure 2A:
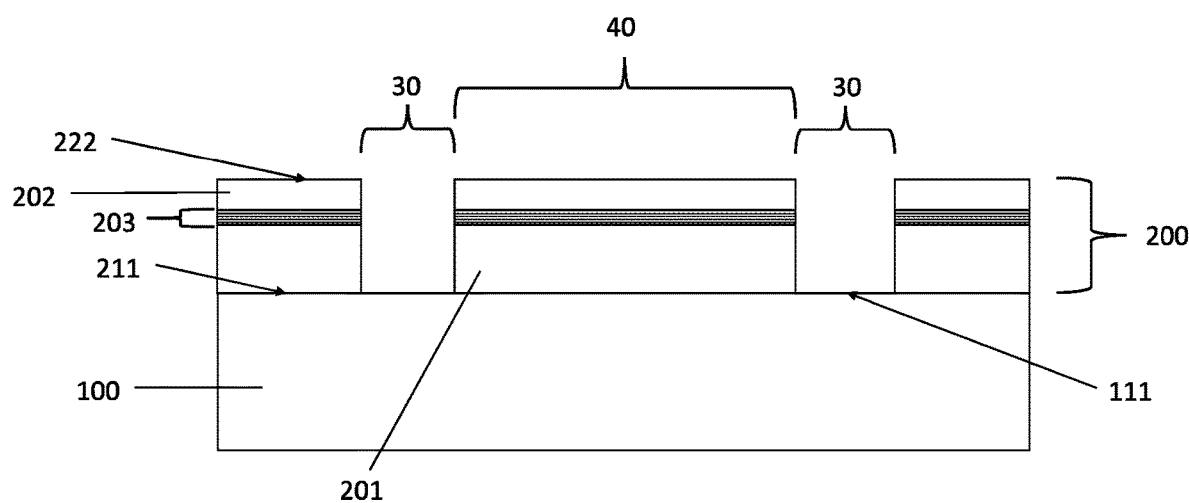
FIG. 2A is an enlarged schematic cross sectional view illustrating a step in the method of forming trenches in the semiconductor layer structure.
Figure 2B:
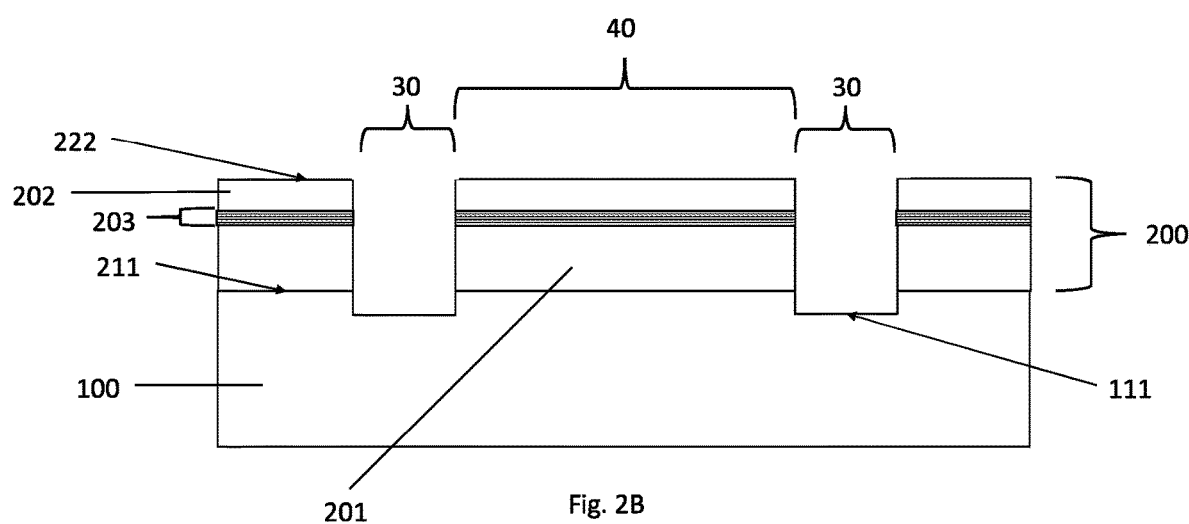
FIG. 2B is an enlarged schematic cross sectional view illustrating an alternate step in the method wherein the trenches extend a distance into the substrate.
Figure 2C:
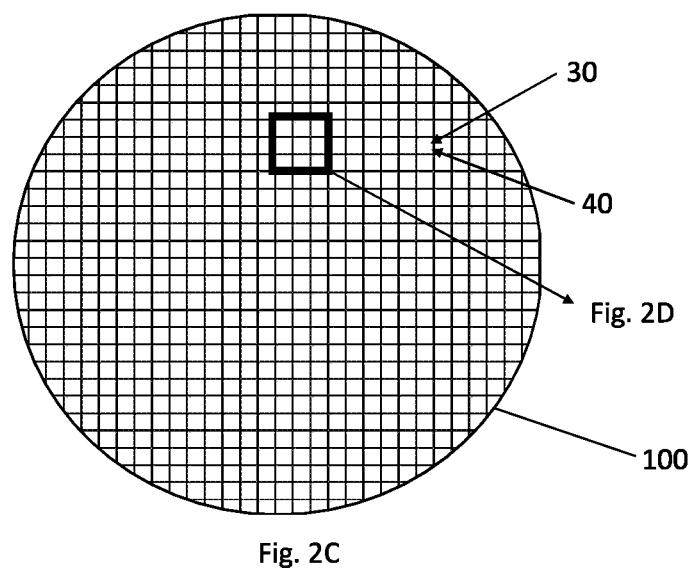
FIG. 2C is an enlarged schematic plan view of the substrate illustrating the trenches in a criss-cross pattern to define individual semiconductor structures.

Referring to FIG. 2A, a suitable process can be used to form trenches 30 through the semiconductor layer structures 200. The trenches 30 can endpoint on the substrate 100 as shown, or alternately as shown in FIG. 2B. The trenches 30 can extend a selected depth into the substrate 100. As shown in FIG. 2C, the semiconductor layer structure 200 can be formed into a plurality of die sized semiconductor structures 40 by forming at least some of the trenches 30 in the lateral direction to separate the semiconductor structures 40 from other adjacent semiconductor structures 40. In addition, prior to forming the trenches 30, other elements of the semiconductor structures 40 such as reflector layers (not shown) can be formed as required.

One suitable process for forming the trenches 30 comprises dry etching through a hard mask. Other suitable processes include photo patterning and etching, laser cutting, saw cutting, diamond cutting, wet etching, dry etching and water jetting. The trenches 30 can extend from the second main surface 222 throughout the semiconductor layer structure 200 and end-point either on or into the substrate 100 by a selected depth. After structuring the semiconductor layer structure 200, the semiconductor structures 40 are electrically insulated from one another. In other words, each semiconductor structure 40 is not connected to the adjacent semiconductor structures 40 surrounding it. The first main surface 211 of the first semiconductor layer 201 is the only contact with the substrate 100. Each first semiconductor layer 201 of each semiconductor structure 40 is separated from the adjacent semiconductor structures 40 surrounding it. Furthermore, as shown in FIG. 2C, the semiconductor structures 40 are physically separated from the adjacent semiconductor structures 40.

Figure 2D:
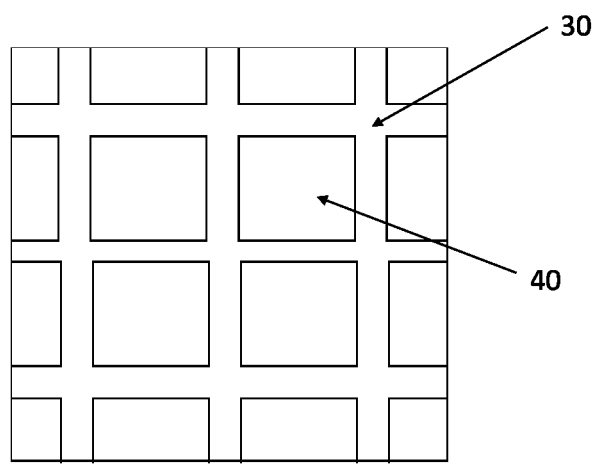
FIG. 2D is an enlarged portion of FIG. 2C taken along section line 2D.

FIG. 2C shows the top view of the substrate 100, which can be in the form of a semiconductor wafer. In this example, the trenches 30 are formed in a criss cross pattern similar to the streets between dice in a conventional semiconductor fabrication process. Each semiconductor structure 40 has a peripheral area or outline, which can be of any geometric shape (e.g., square, rectangular, circular) and size. FIG. 2D is an enlarged view of a portion of FIG. 2C showing the semiconductor structures 40 and the trenches 30. The trenches 30 can also have a selected size, shape and sidewall configuration. An example of a vertical sidewall is shown in FIGS. 2A and 2B. Alternately, the trenches 30 can have sloped sidewalls formed by an etching process.

Figure 3A:
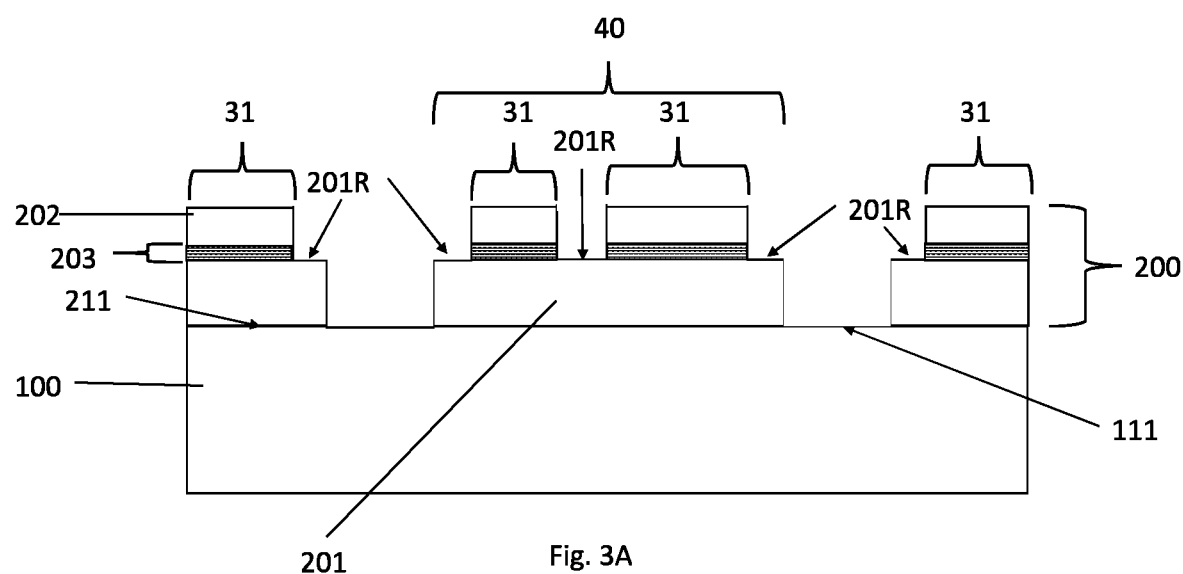
FIG. 3A is an enlarged schematic cross sectional view illustrating a step in the method of forming mesas in the semiconductor layer structure.
Figure 3B:
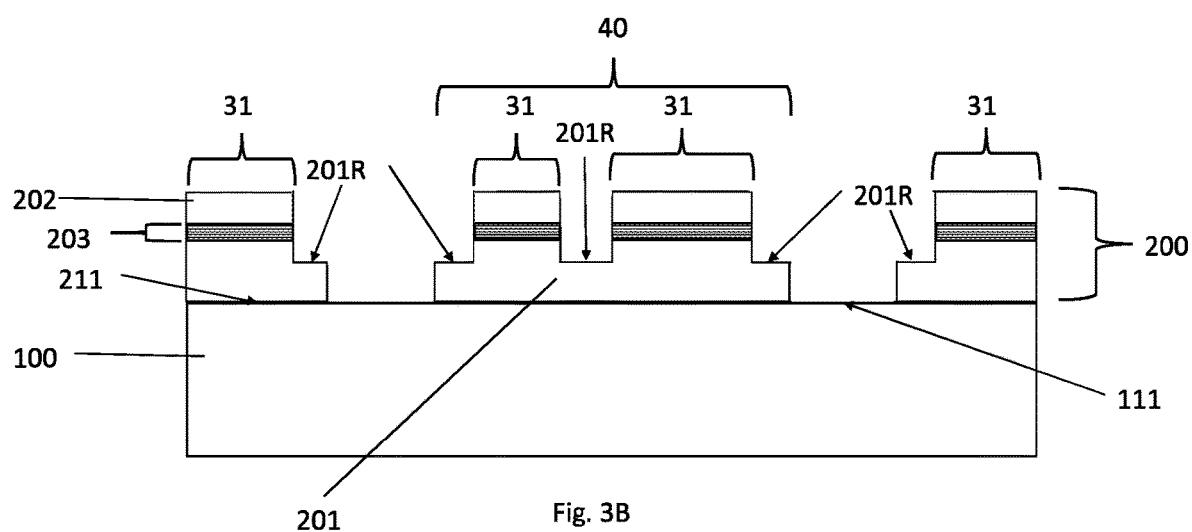
FIG. 3B is an enlarged schematic cross sectional view illustrating an alternate step in the method wherein the mesas have a stepped configuration.

Referring to FIG. 3A, a suitable process can be used to form mesas 31 on the semiconductor structures 40 by etching through the second semiconductor layers 202 and active layers 203 and end-pointing on the first semiconductor layer 201. The mesas 31 are still electrically connected via the remaining first semiconductor layer 201 that has the first main surface 211 facing the substrate 100 and a new surface 201R. FIG. 3B shows an alternate implementation to form mesas 31 with a stepped configuration for the first semiconductor layer 201. The mesas 31 can be formed before forming the trenches 30 or after forming the trenches 30. Each semiconductor structure 40 has at least two mesas 31. The mesas 31 on each semiconductor structure 40 are electrically and physically connected by the first semiconductor layer 201 which is continuous within one semiconductor structure 40.

Figure 4A:
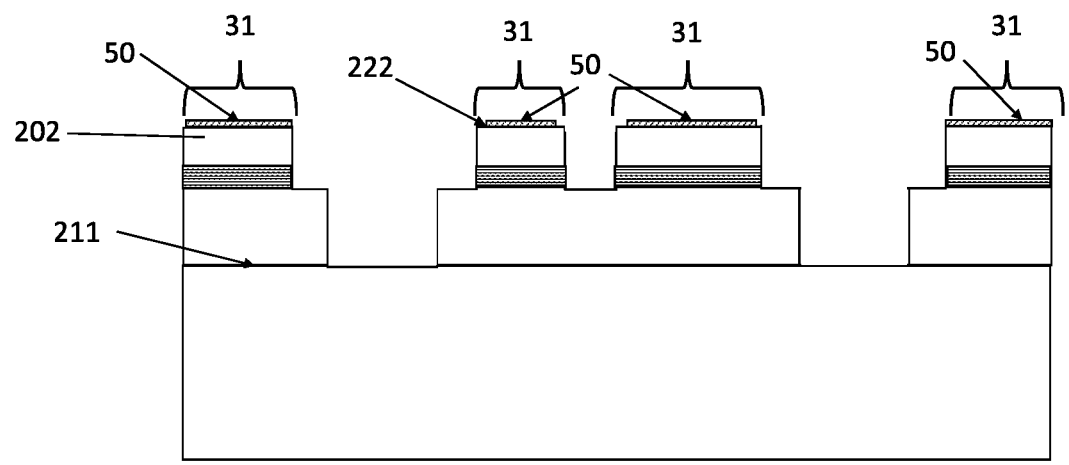
FIG. 4A is an enlarged schematic cross sectional view illustrating a step in the method of forming mirror/ohmic contact layers on the mesas.
Figure 4B:
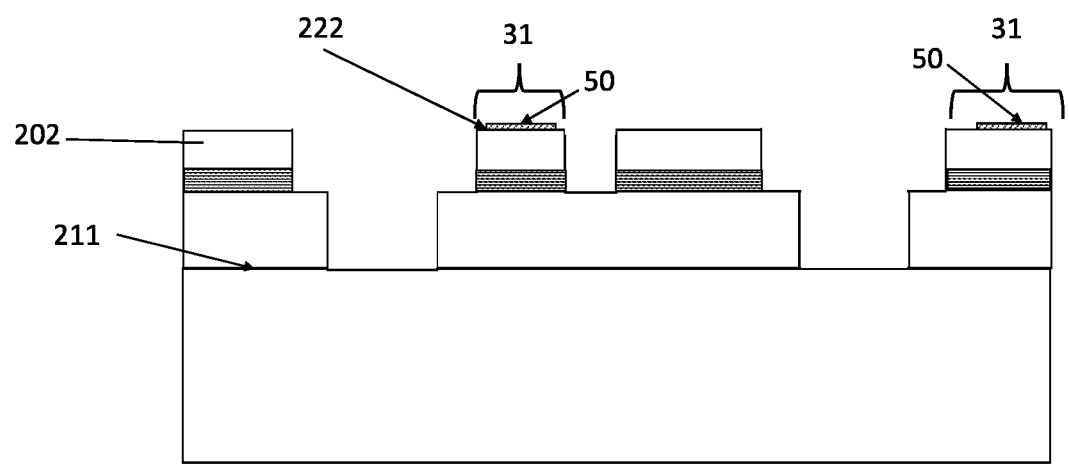
FIG. 4B is an enlarged schematic cross sectional view illustrating an alternate step in the method wherein the mirror/ohmic contact layers are formed on only some of the mesas.

Referring to FIG. 4A, a mirror/ohmic contact layer 50 can be formed directly on top of the second main surface 222 of the second semiconductor layer 202 to reflect electromagnetic radiation toward the first main surface 211. The mirror/ohmic contact layer 50 can be formed by a deposition process, such as CVD, PVD, evaporation, or other suitable depositing technology, along with patterning and etching. A resist lift-off technique can also be used by forming a pattern before depositing the mirror/ohmic contact layer 50 then lift off. Suitable materials include Al, Ag, Au, Pt, Pd, Ni, Rh, Cr, Cu, Ni/Ag, Ni/Au, Ti/Pt, ITO, oxide conductive materials, combination of these materials, or any metals that makes a good ohmic contact to the second main surface 222 of the second semiconductor layer 202. The mirror/ohmic contact layer 50 pattern can be formed directly on top of all mesas 31 or as shown in FIG. 4B only some mesas 31. To make good adhesion and a lower contact resistance, an alloy step can be employed. To obtain a better reflectance, another enhanced-mirror layer can be formed on the mirror/ohmic contact layer 50, from a material such as Al, Ag, Au, Pt, Pd, Ni, Rh, Cr or Cu.

Figure 5A:
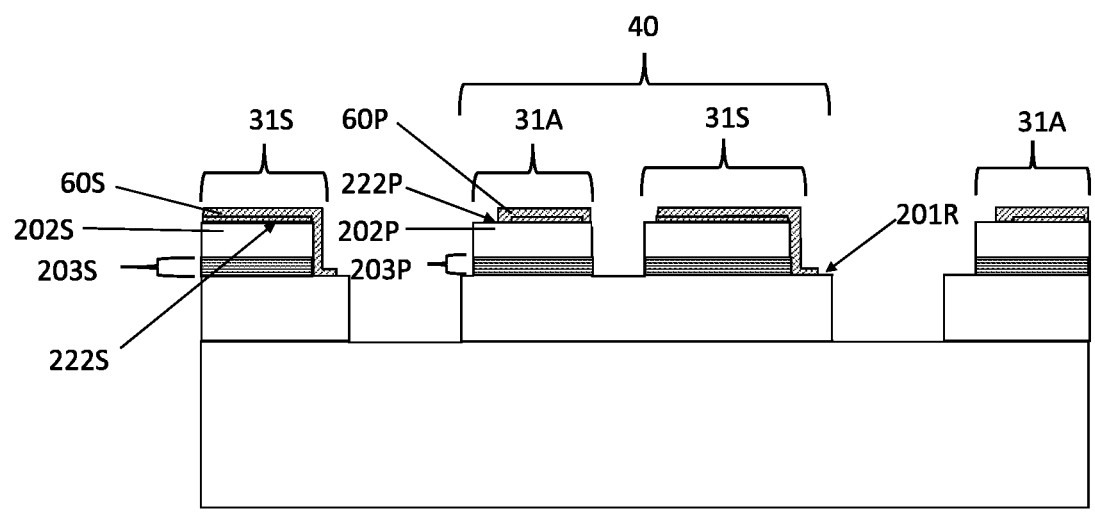
FIG. 5A is an enlarged schematic cross sectional view illustrating a step in the method of forming strapping metal layers on shorting mesas.

Referring to FIG. 5A, each semiconductor structure 40 has at least one shorting mesa 31S and at least one non-shorting mesa 31A. Each shorting mesa 31S includes a strapping metal layer 60S that can comprise multiple layers. The strapping metal layer 60S is configured to electrically connect the second main surface 222S of second semiconductor layer 202S to the first semiconductor layer 201 and to the new 201R surface. The shorting mesa 31S may or may not have a mirror/ohmic contact layer 50 on top of the second main surface 222 of the second semiconductor layer 202S. The strapping metal layer 60S connects the two opposite polarity layers: first semiconductor layer 201 and second semiconductor layer 202S, for example: P-GaN to N-GaN, in effect making a short circuit. The strapping metal layer 60S may or may not make electrical contact to the active layer 203S.

Figure 5B:
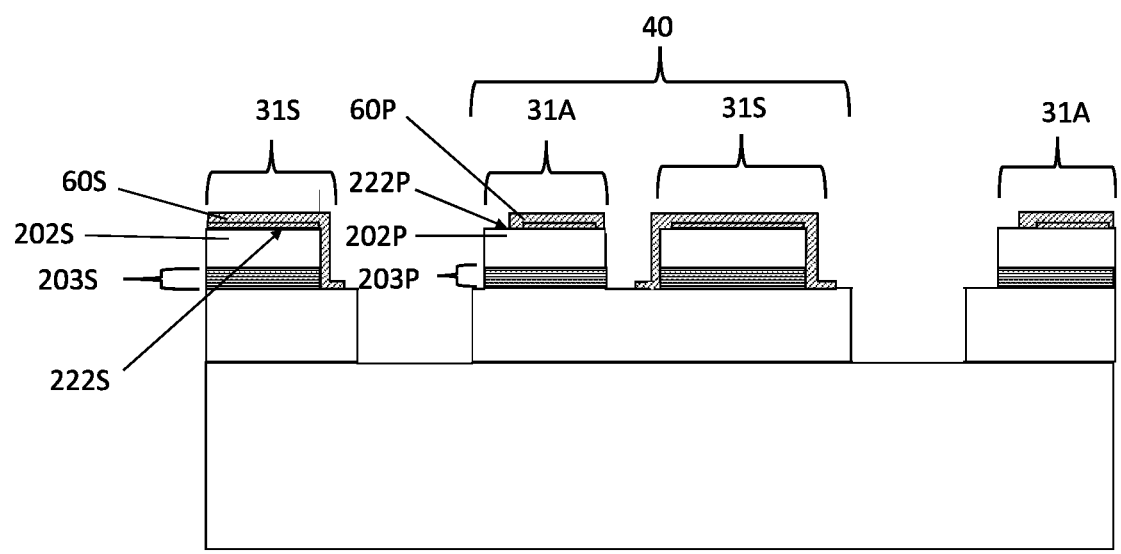
FIGS. 5B, 5C and 5D are equivalent to FIG. 5A but illustrate various alternate embodiments of the strapping metal layers.
Figure 5C:
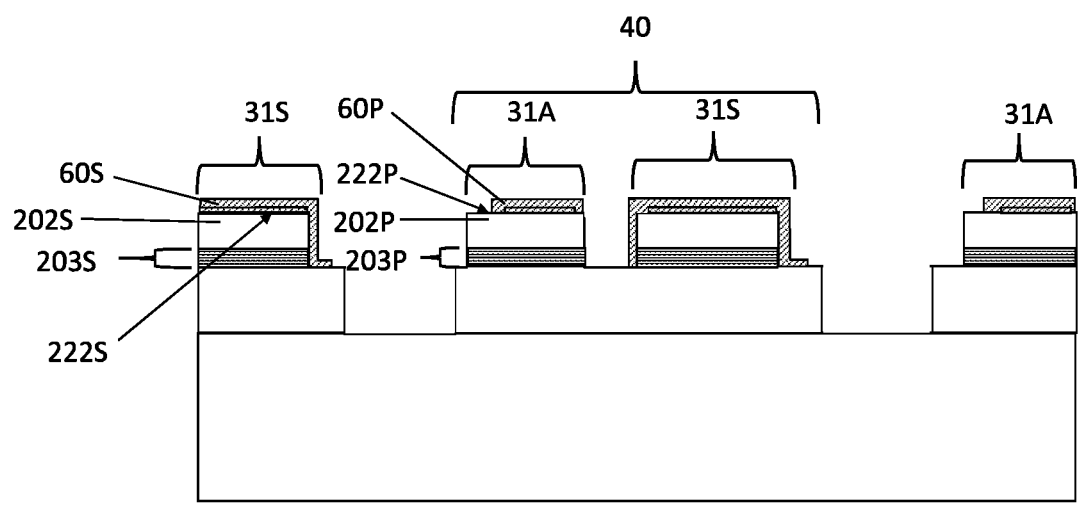

FIGS. 5B and 5C show various implementations of the strapping metal layer 60S to form shorting mesa 31S by electrically connecting the second main surface 222S of the second semiconductor layer 202S to the active layers 203S and to the first semiconductor layer 201 and the surface 211.

Figure 5D:
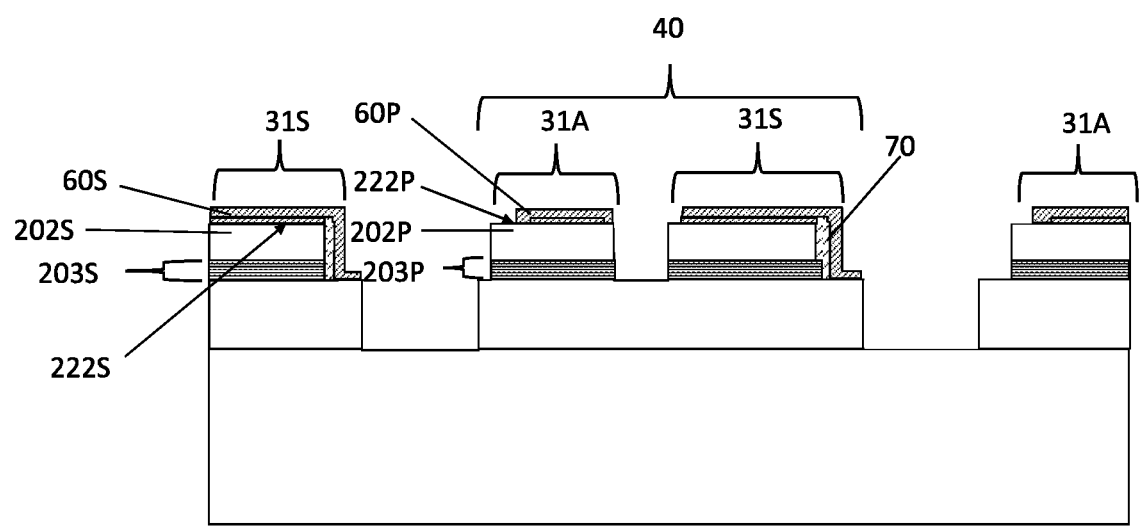

FIG. 5D shows another implementation of the strapping metal layer 60S to form shorting mesa 31S by electrically connecting the second main surface 222S (please note layer 50 is a mirror/ohmic metal) of second semiconductor layer 202S to the first semiconductor layer 201 but not contacting the active layers 203S which is covered by an insulator layer 70. The insulator layer 70 can be one of SiO2, Si3N4, TiO2, insulating polymer or combination and may be formed by deposition, photo then etching or using spacer etch.

As also shown in FIG. 5A, the strapping metal layer 60P only makes electrical contact with the second main surface 222P of the second semiconductor layer 202P and the mirror/ohmic contact layer 50. The strapping metal layer 60P does not make physical contact to the active layers 203P and does not make physical contact to the first semiconductor layer 201. This configuration makes the mesa 31 a non-shorting mesa 31A. The strapping metal layer 60 of the non-shorting mesa 31A is labeled as 60P in FIG. 5A. The non-shorting mesa 31A can have at least one or more mirror/ohmic contact layers 50 disposed above the second semiconductor layer 202P. Each semiconductor body or die 40 has at least one non-shorting mesa 31A and at least one shorting mesa 31S. The strapping metal layers 60P and 60S can be formed at the same time by deposition such as CVD, PVD, evaporation, or other suitable depositing technology then patterned and etch or resist lift-off technique. In addition, an insulator layer/layers such as SiO2, Si3N4, TiO2, insulating polymer or combination of these material can be deposited followed by forming a pattern before depositing the metal conductive layer then lift off the unwanted metal and resist. Suitable materials for the strapping metal layers 60P and/or 60S include Ti, Pd, chrome, Ni, Au, Al, Ni/Ag, Ni/Au, Ti/Pt, Ti/TiN/Al or any metal that makes a good ohmic contact to the first semiconductor layer surface 201R. The strapping metal layers 60S and 60P pattern can be formed on all mesas 31 or only on some mesas 31. To make good adhesion, an alloy step can also be employed. FIGS. 5A, 5B, 5C and 5D illustrate various examples of possible implementations of the strapping metal layers 60S for shorting mesa 31S.

Figure 6:
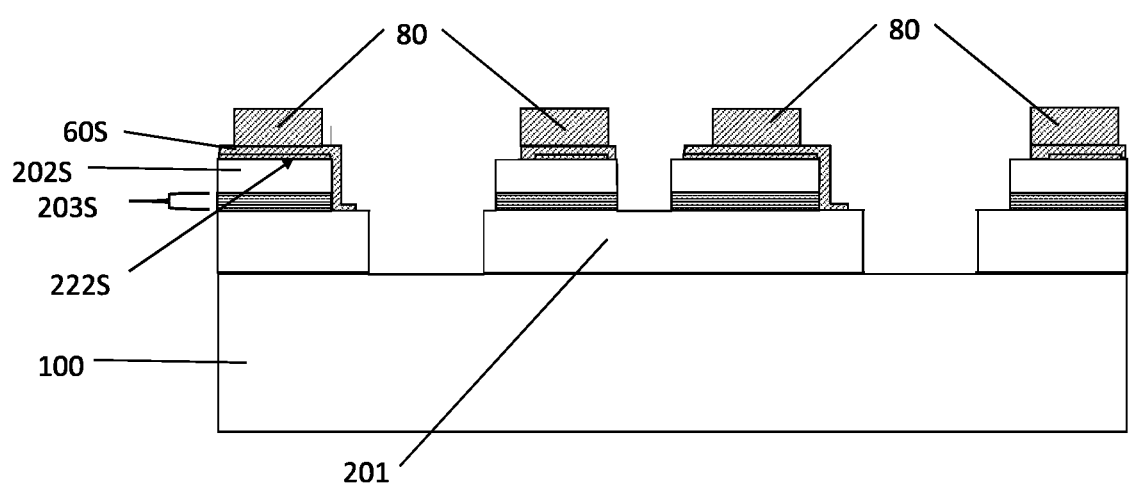
FIG. 6 is an enlarged schematic cross sectional view illustrating a step in the method of forming metal contact pads on the mesas.

Referring to FIG. 6, the semiconductor structure 40 can also include additional metal contact pads 80 formed on the conductive strapping layers 60. The additional metal contact pads 80 are optional. The metal contact pads 80 can be formed by deposition, such as CVD, PVD, evaporation, or other suitable depositing technology. Deposition can be followed patterning and etching or a resist lift-off technique by depositing an insulator layer/layers such as SiO2, Si3N4, TiO2, insulating polymer or combination of these material then forming a pattern before depositing the metal conductive layer then lift off the unwanted metal and resist. Suitable metals for the contact pads 80 include Ti, Pd, chrome, Ni, Au, Al, Ni/Au, Ti/Al/Ni/Au, Ti/TiN/Al or combination of metal, multi-layer of metal layers. Indium metal balls (not shown) can be formed on the metal contact pads 80. Metal stud such as copper (not shown) can also be formed on the metal contact pads 80. Various eutectic metal layers, such as AuSn, CuSn, AgSn, AuIn, AuGe, AlSi, AuSi can also be the last metal layer (not shown) on the metal contact pads 80 allowing eutectic bonding to a backplane or PCB. Various solder metal or solder balls, such as Sn—Ag—Cu (SAC), tin-lead, tin, silver, nano silver, Sn—Ag—Cu—Mn can also be the last metal layer or ball (not shown) on the metal contact pads 80 to allowing eutectic bonding to a backplane or PCB.

Figure 7:
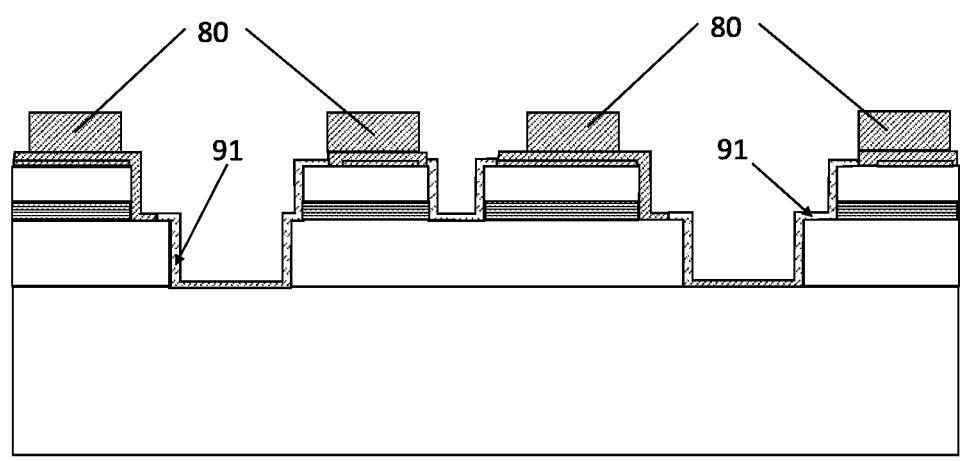
FIG. 7 is equivalent to FIG. 6 but shows an optional additional step of formed an insulator layer on the semiconductor structures.

Referring to FIG. 7, it is optional to have the exposed active area on the lateral side of the semiconductor structure 40 covered with an insulator layer 91. For example, silicon oxide, silicon nitride, an organic insulator such as polyimide.

Figure 8:
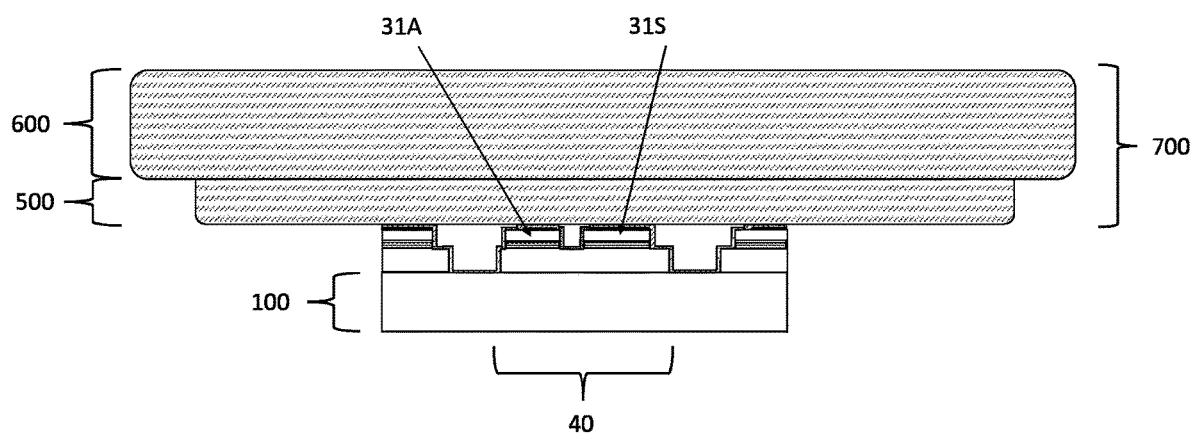
FIG. 8 is an enlarged schematic cross sectional view illustrating a step in the method of placing an elastomeric polymer layer on a plate on the semiconductor structures.

Referring to FIG. 8, an elastomeric polymer layer 500 having adhesive characteristics is placed on one or more semiconductor structures 40. The elastomeric polymer layer 500 can be formed on a plate 600 ("receiving plate") forming an assembly 700. The elastomeric polymer layer can have a desired hardness and adhesive force to prevent the semiconductor structures 40 from cracking or rotating during a subsequent lift-off process. In addition, the mesas 31A, 31S provide a structure for contacting the elastomeric polymer layer 500. For example, the metal contact pads 80 (FIG. 7) on the mesas 31A, 31S can be in physical contact with the elastomeric polymer layer 500 with an adhesive force applied by the elastomeric polymer layer 500. In illustrative embodiment, the elastomeric polymer layer 500 comprises silicone. Other suitable materials include siloxane, rubber, or other elastomeric based material. Other elastomeric polymers such as PVC, SBS/sorbothane and neoprene are also suitable.

Figure 9:
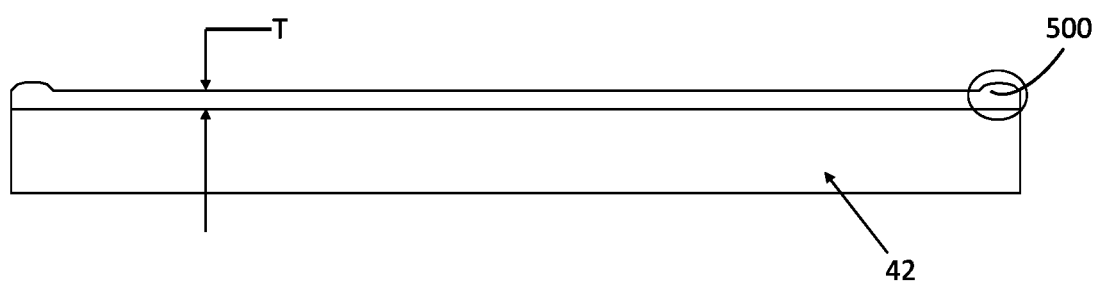
FIG. 9 is an enlarged schematic cross sectional view illustrating characteristics of the plate and the elastomeric polymer layer.

Referring to FIG. 9, the elastomeric polymer layer 500 can be formed on the plate 600. Suitable materials for the plate 600 include glass, quartz, tungsten, molybdenum, copper, titanium, silicon, sapphire, aluminum oxide ($Al_2O_3$), silicon, gallium nitride, silicon carbide, germanium (Ge), zinc oxide (ZnO), gallium nitride (GaN), aluminum nitride (AlN), zinc selenium (ZnSe) and gallium arsenide (GaAs). The plate 600 and elastomeric polymer layer 500 allow one to handle the semiconductor structures 40 after separation from the substrate 100. If the elastomeric polymer layer 500 comprises a curable elastomeric polymer such as silicone, siloxane, rubber, or other elastomeric based material this layer can be formed by a spin-on process. Other elastomeric polymers, such as PVC, SBS/sorbothane and neoprene are also suitable. Further, the receiving plate 600 preferably has a TTV (total thickness variation) of <5 μm. For forming the elastomeric polymer layer 500 the elastomer can be dispensed on the center of the receiving plate 600 using a spin coater to provide a selected thickness T (e.g., ~20 μm). For a spin-on process, the thickness T of the elastomeric polymer layer 500 will be a function of spin speed, the spin-on liquid viscosity and other factors. Normally the thickness T is radially dependent. To provide optimum thickness uniformity, one would use a larger diameter receiving plate 600. Rather than spin coating, the elastomeric polymer layer 500 can also be applied by vapor deposition, doctor blade, or screen printing. The elastomeric polymer layer 500 can be applied on the plate 600 using spin-on techniques then cured at temperature less than 500° C. In particular, 150° C. for 30 minutes is suitable for one suitable adhesive.

Figure 10A:
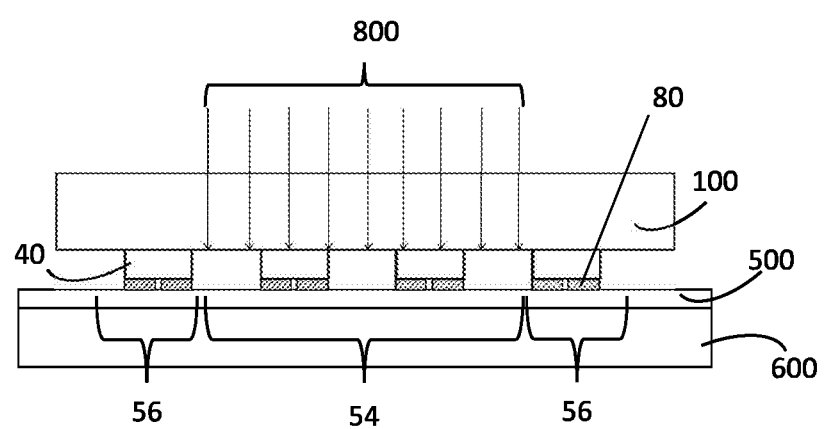
FIGS. 10A-10C are enlarged schematic cross sectional views illustrating a separating step of the method performed using a laser lift off (LLO) process.

Referring to FIG. 10A, for simplicity, in FIG. 10A, each die sized semiconductor structure 40 is shown with only a single GaN layer and a pair of external pad contact pads 80 that has been separated from substrate 100. Next as shown in FIG. 10A, suitable chemical, mechanical or physical technique can be used such as CMP (chemical mechanical polishing), wet or dry etching, or a laser. A combination of techniques can also be used. By way of example, a laser lift-off process of the substrate 100 comprised of sapphire can be accomplished by pulse laser irradiation.

Figure 10B:
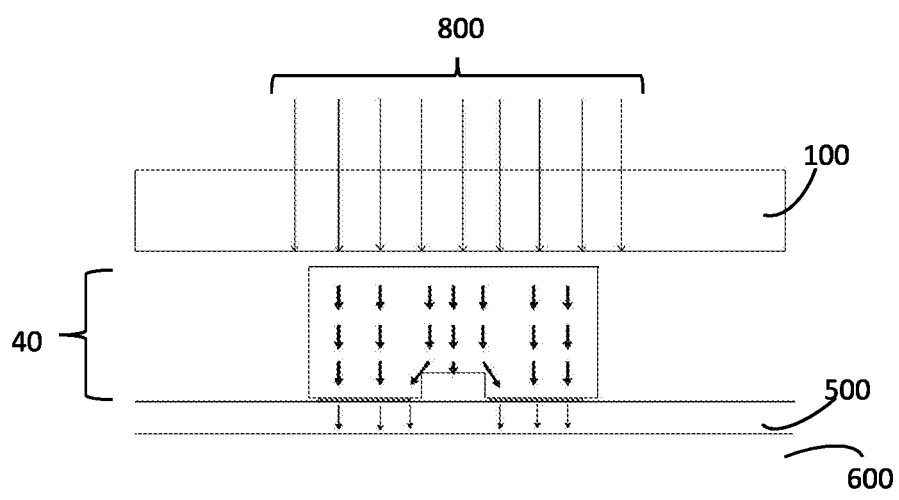

Referring to FIG. 10B, the method can also include the step of performing a separating step using a laser lift-off (LLO) process. During the laser lift-off process, a uniform laser beam 800 is directed through the substrate 100 onto an interfacial of semiconductor layer 201 at the interface with the substrate 100 (211/111 interface) to lift off the semiconductor structures 40 onto the elastomeric polymer layer 500 surface. During the laser lift-off (LLO) process each semiconductor structure 40 is individually pushed towards the elastomeric polymer layer 500 surface by decomposition of the interfacial layer of semiconductor layer 201 as shown in FIG. 10B. With the interfacial semiconductor layer 201 comprised of GaN, decomposition will be to gallium (Ga) and nitrogen (N2) in gaseous form. In FIG. 10B, this explosive force is represented by explosive force arrows 52 that pass through the semiconductor structure 40 and are absorbed by the elastomeric polymer layer 500 on the plate 600. The elastomeric polymer layer 500 acts as a soft cushion or shock absorber to absorb the kinetic energy from the semiconductor structure 40 via momentum energy transfer. The semiconductor structure 40 comes to rest on the elastomeric polymer layer 500 undamaged and stays in the desired position on the elastomeric polymer layer 500 on the plate 600.

The method can also include the step of selecting a laser wavelength and power such that during the laser lift-off (LLO) process, the laser beam 800 can transmit through the substrate 100 and be absorbed by the semiconductor layer at the interface with the substrate 100. In addition, by selecting the laser wavelength and power, the laser beam 800 carries a laser energy density well below an absorption threshold of the substrate 100. In addition, a few percentages of loss of the reflected/scattered laser energy density on the surface of the substrate 100, allows the majority of the laser energy density to transmit through the substrate 100. In contrast, the transmitted laser energy density is high enough to cause photo-inducted lift-off of the semiconductor structures 40 from the substrate 100 at the interface with the substrate 100, which allows debonding of the semiconductor layer at the interface. However, the elastomeric polymer layer 500 prevents any damage to the semiconductor structures 40 by momentum transfer. In addition, the elastomeric polymer layer 500 holds the semiconductor structure 40 in place.

With the substrate 100 comprised of sapphire and the first semiconductor layer 201 comprised of GaN, it is important to have an uniform laser beam 800 having a beam size greater than the individual semiconductor structures 40 to deliver sufficient photon energy to the GaN layer at the sapphire/GaN interface. By selecting the appropriate laser wavelength, a UV-laser can transmit through the sapphire substrate and be absorbed by the GaN layer at the GaN/Sapphire interface. The GaN layer contains a very high density of various defects due to a large lattice mismatch. The crystal defects, such as dislocations, nanopipes and inversion domains also result in higher absorption of incident UV light. By selecting the correct laser wavelength and power, the incident laser beam for the lift-off process carries an energy density well below the absorption threshold of the substrate 100, allowing it to transmit through the substrate 100. In contrast, the laser energy density is high enough to cause photo-induced decomposition of the first semiconductor layer 201 at the surface 111, which allows debonding. Studies exist regarding the UV laser lift-off process. During laser lift-off (LLO), GaN can decompose so quickly into gallium metal vapor and nitrogen gas resulting in an explosive force acting on the semiconductor structure 40 and the substrate 100. By way of example, the semiconductor structure 40 can be less than 20 μm thick and less than 150 μm in horizontal dimension, while the substrate 100 can be more than 50 μm thick and more than 1000 μm in horizontal dimension. The semiconductor structure 40 is very much smaller (weight as well as size) than the substrate 100, during LLO, the thermo decomposition of the material at the interface (for the case of GaN, GaN is decomposed to be Ga and Nitrogen) would exert a large force to the die causing it to push toward the elastomeric polymer layer. Due to the momentum transfer, the semiconductor structure 40 is pushed out from the substrate 100 with tremendous force. If the semiconductor structure 40 were to hit a hard surface, the semiconductor structure 40 would be shattered causing cracking or random placement of the semiconductor structure 40 that would render the semiconductor structure 40 useless.

The method can used to fabricate semiconductor structures 40 in the form of light emitting diode (LED) dice having desired thickness. This thickness can be as thin as the thickness of the epitaxial layers (layer 201+layer 202+layer 203) plus the metal layers thickness (layer 50+layer 60+layer 80). Since no secondary substrate is required, the resulting thickness (T) can be as thin as 10 μm or less than 50 μm. The method is particularly effective for mini or micro LED die having width (W) and length (L)<200 um, and in particular less than 150 μm. The mechanical strength of the semiconductor structure 40 is important to withstand the violent force (F) created by the LLO process. Besides the mechanical strength of the material, (for our case the semiconductor structure), the aspect ratios of the die W/T, L/T and W/L are also important. It is preferred to have the ratios to be less than 10, for example: W/L<5, W/T<5.

Still referring to FIG. 10B, an exemplary laser lift-off (LLO) process uses a 248 nm laser beam 800, and the receiving plate 600 is preferably flat with a TTV (total thickness variation) of less than <5 μm, but more preferably less than <2 um, for preventing flipping, titling, rotating and cracking of the semiconductor structure 40 after the laser lift-off (LLO) process. In addition, the receiving plate 600 can include one or more alignment marks for aligning the semiconductor structure 40 formed on the substrate 100. Proper alignment also ensures proper placement of the semiconductor structure 40 on the receiving plate 600 following the laser lift-off (LLO) process (i.e., desired coordinate on the receiving plate 600). In addition, the receiving plate 600 can include one or more notches or flats for pre-alignment.

Figure 10C:
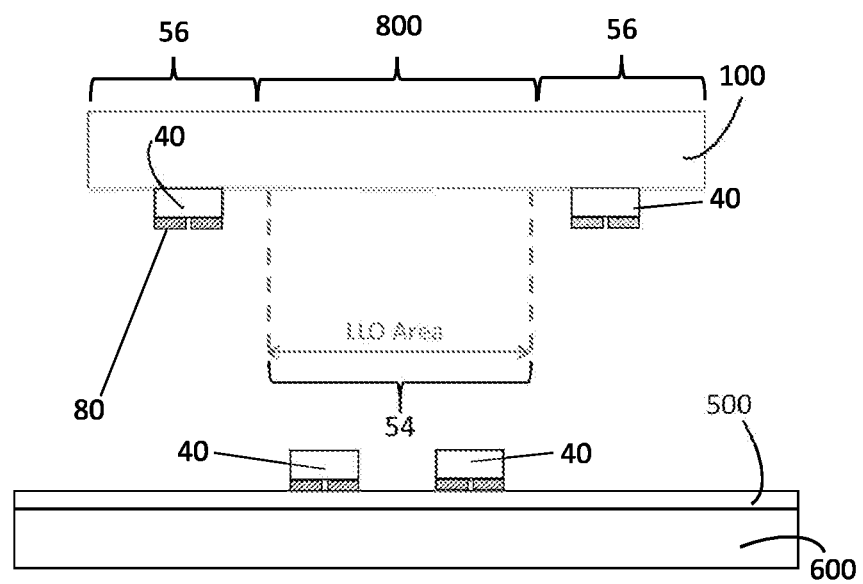

Referring to FIG. 10C, a laser lift off area 54 can be selectively located by appropriate focusing of the laser beam 800 to lift selected semiconductor structures 40 onto the receiving plate 600. Using the receiving plate 600, one could selectively remove certain semiconductor structures 40 without performing laser lift-off (LLO) on the entire substrate 100. FIG. 10C illustrates non-laser lift-off (LLO) areas 56 outside of the laser lift-off (LLO) area 54 that selectively removes two of the semiconductor structures 40 leaving the rest unaffected. One can selectively laser lift-off (LLO) one semiconductor structure 40 at a time to the receiving plate 600 by orienting the semiconductor structure 40 at certain (x,y) coordinates on the receiving plate 600. In addition, any bad semiconductor structures 40 can remain on the receiving plate 600, such that after laser lift-off (LLO) there are only known good semiconductor structures 40 on the receiving plate 600 at a known x,y coordinate.

Following the laser lift-off (LLO) process, the method can also include the step of cleaning and/or etching the surface of the semiconductor structures 40 on the receiving plate 600. The semiconductor structures 40 on receiving plate can be etched using various techniques such as wet etching, dry etching, photo enhanced chemical etching to create rough (not shown) surface 211 to improve its performance such as improving light extraction, output, handling.

One can remove the semiconductor structures 40 from the receiving plate 600 using a conventional technique such as a vacuum pick and place mechanism for semiconductor dice, or using a stamp having higher adhesive force to remove the semiconductor die.

Figure 11:
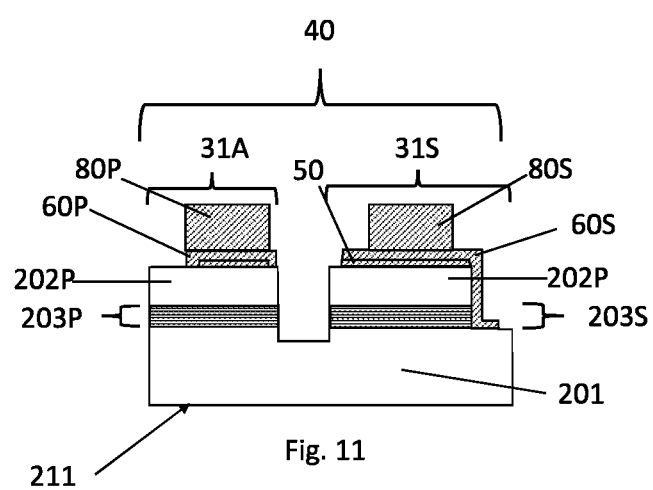
FIG. 11 is an enlarged schematic cross sectional view illustrating a singulated semiconductor structure in the form of a light emitting diode (LED) die.

Referring to FIG. 11, a completed semiconductor structure 40 that has been separated from the elastomeric polymer layer 500 comprises a light emitting diode (LED) die. The semiconductor structure 40 includes two mesas: a non-shorting mesa 31A and a shorting mesa 31S. The mesas 31A, 31S are connected by the first semiconductor layer 201, which is in the form of an n-type confinement layer or N-layer. In addition, each mesa 31A, 31S has its active layer 203P (multiple quantum well (MQW) layer) disposed above the first semiconductor layer 201 (n-type confinement layer or N-layer). In addition, a second semiconductor layer in the form of a p-type confinement layer or P-layer 202P is disposed above the active layer 203P (multiple quantum well (MQW) layer). Further, the non-shorting mesa 31A has a non-shorting strapping metal layer 60P configured as a P-metal layer making contact to a mirror/ohmic contact layer 50 and to the p-type confinement layer 202P. The p-type confinement layer 202P is disposed above the active layer 203P (multiple quantum well (MQW) layer). The active layer 203P is disposed above the first semiconductor layer 201 (continuous n-type confinement layer (N-layer)). The first semiconductor layer 201 (continuous n-type confinement layer (N-layer)) connects the non-shorting mesa 31A and the shorting mesa 31S. The shorting mesa 31S has an active layer 203S (multiple quantum well (MQW) layer) which is disposed above the first semiconductor layer 201 (continuous n-type confinement layer (N-layer)). The shorting mesa 31S also includes a p-type confinement layer (P-layer) 202S disposed above an active layer 203S (multiple quantum well (MQW) layer). A strapping P-metal layer 60S disposed above p-type confinement layer (P-layer) 202S makes contact to the mirror/ohmic contact layer 50. Once power is applied to the two contact pads 80P, 80S, light emits from the active layer (multiple quantum well (MQW) layer) 203P of the 31A non-shorting mesa.

Figure 12:
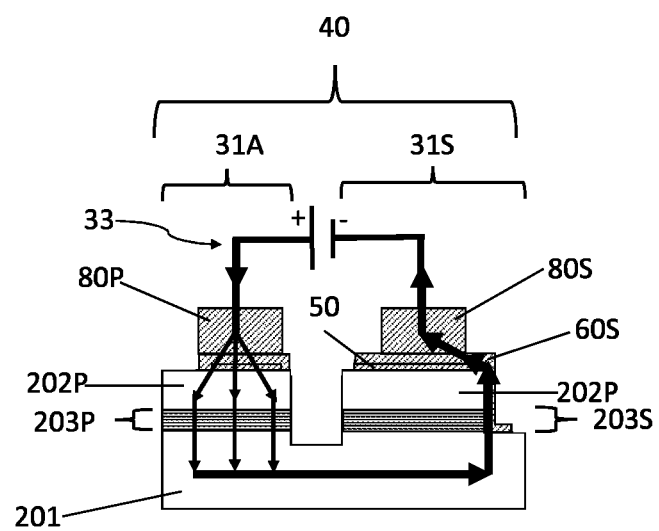
FIG. 12 is an enlarged schematic cross sectional view illustrating the singulated semiconductor structure in operation with power applied.

Referring to FIG. 12, the completed semiconductor structure 40 includes a non-shorting mesa 31A and a shorting mesa 31S. During operation of the semiconductor structure, when a power source is connected to the semiconductor structure 40, the current flow 33 passes from the p-metal pad 80P on top of the non-shorting mesa 31A, to the n-metal pad 80S on top of the shorting mesa 31S. The current flow 33 also passes into the semiconductor structure 40 through the non-shorting mesa pad 80P. In addition, the current flow 33 passes through the second semiconductor layer 202P and the active layer 203P of the non-shorting mesa 31 and into the first semiconductor layer 201. The current flow 33 then passes through the strapping metal layer 60S of the shorting mesa 31S and out though the metal contact pad 80S of the shorting mesa 31S. For the shorting mesa 31A, the majority of current flow 33 would pass through the strapping metal layer 60S to flow from the first semiconductor layer 201 to the second semiconductor layer 202S. Therefore, there is no electron-hole recombination effect in the active layer 203S resulting in no photon/light generated by the active layer 203S of the shorting mesa 31S. For the non-shorting mesa 31A, the current flow 33 passes through the second semiconductor layer 202P and also passes through the active area 203P of the non-shorting mesa 31A, before passing through the first semiconductor layer 201. When current flow 33 passes through the active area 203P, holes are generated and electrons flows across the n-region and combine with the holes in the p-region; with electron-hole recombination effect in the active layer 203P, photon/light is generated in the active layer 203P of the non-shorting mesa 31A. Light can thus be generated from the active layer 203P of the non-shorting mesa 31A of the semiconductor structure 40. Conversely light cannot be generated from the active layer 203S of the shorting mesa 31S of semiconductor structure 40.

Some advantages of the method include one or more of the following: thin, small and uniform thickness semiconductor structures pre-arranged on a polymer surface, semiconductor structures having co-planar electrodes enable easier and higher bonding strength to a driver backplane, mass transfer and bonding is possible, a simpler and lower cost method for fabricating and producing semiconductor components.

While a number of exemplary aspects and embodiments have been discussed above, those of skill in the art will recognize certain modifications, permutations, additions and subcombinations thereof. It is therefore intended that the following appended claims and claims hereafter introduced are interpreted to include all such modifications, permutations, additions and sub-combinations as are within their true spirit and scope.

What is claimed is:

1. A semiconductor component for fabricating semiconductor structures comprising:
   a plate having an elastomeric polymer layer thereon; and
   a semiconductor structure on the plate, the semiconductor structure comprising:
      a first semiconductor layer, a second semiconductor layer and an active layer between the first semiconductor layer and the second semiconductor layer;
      a plurality of mesas comprising separated portions of the first semiconductor layer, the second semiconductor layer and the active layer, the mesas including a shorting mesa and a non-shorting mesa, the non-shorting mesa configured to apply a current to the active layer for generating photon/light in a first portion of the active layer of the non-shorting mesa; and
      a strapping metal layer on the shorting mesa electrically connecting the second semiconductor layer to the first semiconductor layer providing a short circuit for the current and no photon/light generated by a second portion of the active layer of the shorting mesa;
      wherein the shorting mesa and the non-shorting mesa have substantially a same height and are configured for engagement with the elastomeric polymer layer.

2. The semiconductor component of claim 1 wherein each mesa includes a metal contact pad configured to adhesively contact the elastomeric polymer layer, and to provide a contact for providing external power to the semiconductor component.

3. The semiconductor component of claim 1 wherein the shorting mesa and the non-shorting mesa are separated by a trench.

4. The semiconductor component of claim 1 wherein the shorting mesa and the non-shorting mesa include a mirror/ohmic contact layer.

5. The semiconductor component of claim 1 wherein the shorting mesa includes a mirror/ohmic contact layer in contact with the strapping metal layer.

6. A semiconductor component for fabricating semiconductor structures comprising:
   a plate having an elastomeric polymer layer thereon; and
   a semiconductor structure on the plate, the semiconductor structure comprising:
      a first semiconductor layer, a second semiconductor layer and an active layer between the first semiconductor layer and the second semiconductor layer;

a plurality of mesas comprising separated portions of the first semiconductor layer, the second semiconductor layer and the active layer, the mesas including a shorting mesa and a non-shorting mesa, the non-shorting mesa configured to apply a current to the active layer for generating photon/light in a first portion of the active layer of the non-shorting mesa; and a strapping metal layer on the shorting mesa electrically connecting the second semiconductor layer to the first semiconductor layer providing a short circuit for the current and no photon/light generated by a second portion of the active layer of the shorting mesa;

wherein the semiconductor structure comprises a light emitting diode (LED) die comprising a mini or micro (LED) die having a width (W) and a length (L) of less than 150µm. and a thickness (T) of less than 5µm.

7. A semiconductor component for fabricating semiconductor structures comprising:

a plate having an elastomeric polymer layer thereon; and
a semiconductor structure on the plate, the semiconductor structure comprising:
a first semiconductor layer, a second semiconductor layer and an active layer between the first semiconductor layer and the second semiconductor layer;
a plurality of mesas comprising separated portions of the first semiconductor layer, the second semiconductor layer and the active layer, the mesas including a shorting mesa and a non-shorting mesa, the non-shorting mesa configured to apply a current to the active layer for generating photon/light in a first portion of the active layer of the non-shorting mesa; and
a strapping metal layer on the shorting mesa electrically connecting the second semiconductor layer to the first semiconductor layer providing a short circuit for the current and no photon/light generated by a second portion of the active layer of the shorting mesa;
wherein the plate includes a laser lift off (LLO) area containing a plurality of semiconductor components on the elastomeric polymer layer.

8. The semiconductor component of claim 7 wherein the semiconductor structure comprises a known good semiconductor structure at a known x,y coordinate on the plate.

9. The semiconductor component of claim 7 wherein the semiconductor component has a thickness equal to the combined thicknesses of the first semiconductor layer, the second semiconductor layer, the active layer and the strapping metal layer.

10. A semiconductor component for fabricating semiconductor structures comprising:

a plate having an elastomeric polymer layer thereon; and
a semiconductor structure on the plate, the semiconductor structure comprising:
a first semiconductor layer, a second semiconductor layer and an active layer between the first semiconductor layer and the second semiconductor layer;
a plurality of mesas comprising separated portions of the first semiconductor layer, the second semiconductor layer and the active layer, the mesas including a shorting mesa and a non-shorting mesa, the non-shorting mesa configured to apply a current to the active layer for generating photon/light in a first portion of the active layer of the non-shorting mesa; and
a strapping metal layer on the shorting mesa electrically connecting the second semiconductor layer to the first semiconductor layer providing a short circuit for the current and no photon/light generated by a second portion of the active layer of the shorting mesa;

wherein the semiconductor component has a thickness of less than 50µm, a width (W) of less than 200µm and a length (L) of less than 200µm.

11. A semiconductor component for fabricating semiconductor structures comprising:

a plate having an elastomeric polymer layer thereon; and
a semiconductor structure on the plate, the semiconductor structure comprising:
a first semiconductor layer, a second semiconductor layer and an active layer between the first semiconductor layer and the second semiconductor layer;
a plurality of mesas comprising separated portions of the first semiconductor layer, the second semiconductor layer and the active layer, the mesas including a shorting mesa and a non-shorting mesa, the non-shorting mesa configured to apply a current to the active layer for generating photon/light in a first portion of the active layer of the non-shorting mesa; and
a strapping metal layer on the shorting mesa electrically connecting the second semiconductor layer to the first semiconductor layer providing a short circuit for the current and no photon/light generated by a second portion of the active layer of the shorting mesa;
wherein the plate is flat with a TTV (total thickness variation) of less than <5µm.

12. A semiconductor structure comprising:

a semiconductor layer structure comprising a first semiconductor layer having a first polarity and a second semiconductor layer having a second polarity with an active layer therebetween configured to emit electromagnetic radiation; and
a shorting mesa and a non-shorting mesa physically connected to the first semiconductor layer, each mesa including portions of the first semiconductor layer, the second semiconductor layer and the active layer, the non-shorting mesa configured to apply a current to the active layer for generating photon/light in a first portion of the active layer of the non-shorting mesa, the shorting mesa including a strapping conductive layer electrically connecting the second semiconductor layer and the first semiconductor layer for making a short circuit for the current during operation of the semiconductor structure resulting in no photon/light generated by a second portion of the active layer of the shorting mesa, the shorting mesa and the non-shorting mesa having planar surfaces configured for engagement with a polymer elastomeric layer.

13. The semiconductor structure of claim 12 further comprising one or more metal contact pads formed on the shorting mesa and the non-shorting mesa.

14. The semiconductor structure of claim 12 wherein the semiconductor structure comprises a light emitting diode (LED) die.

15. The semiconductor structure of claim 12 wherein the semiconductor structure comprises a flip chip light emitting diode (FCLED) die and the shorting mesa and the non-shorting mesa provide the physical structure for supporting metal contact pads.

16. The semiconductor structure of claim 12 wherein the semiconductor structure comprises a mini or micro LED die having a width (W) and a length (L) of less than 150µm, and a thickness (T) of less than 5µm.

17. A method for fabricating semiconductor structures comprising:
providing a substrate having a desired size and shape;
forming a semiconductor layer structure on the substrate comprising a first semiconductor layer, a second semiconductor layer and active layer therebetween;
forming a plurality of trenches in the semiconductor layer structure to define the semiconductor structures;
forming a plurality of mesas comprising separated portions of the first semiconductor layer, the second semiconductor layer, and the active layer including at least one shorting mesa and at least one non-shorting mesa, the non-shorting mesa configured to apply a current to the active layer for generating photon/light in a first portion of the active layer of the non-shorting mesa, and a strapping metal layer on the shorting mesa electrically connecting the second semiconductor layer to the first semiconductor layer providing a short circuit for the current and no photon/light generated by a second portion of the active layer of the shorting mesa;
forming an elastomeric polymer layer on a plate;
attaching the elastomeric polymer layer to the semiconductor structures; and
separating the semiconductor structures from the substrate with the semiconductor structures attached to the plate.

18. The method of claim 17 wherein the separating step comprises a laser lift-off (LLO) process.

19. The method of claim 17 wherein the forming the plurality of mesas step comprises etching the semiconductor layer structure.

20. The method of claim 17 wherein the plate comprises a material selected from the group consisting of glass, quartz, tungsten, molybdenum, copper, titanium, silicon, sapphire, aluminum oxide ($Al_2O_3$), silicon, gallium nitride, silicon carbide, germanium (Ge), zinc oxide (ZnO), gallium nitride (GaN), aluminum nitride (AlN), zinc selenium (ZnSe) and gallium arsenide (GaAs).

21. The method of claim 17 wherein the elastomeric polymer layer comprises a material selected from the group consisting of silicone, siloxane, rubber, PVC, SBS/sorbothane and neoprene.

22. The method of claim 17 wherein the shorting mesa and the non- shorting mesa have substantially a same height and are configured for engagement with the elastomeric polymer layer.

* * * * *